United States Patent [19]
Saito et al.

[11] Patent Number: 5,972,420
[45] Date of Patent: Oct. 26, 1999

[54] MAGNETORESISTIVE SENSOR MANUFACTURING METHOD

[75] Inventors: Masamichi Saito; Toshinori Watanabe; Kiyoshi Sato; Toshihiro Kuriyama, all of Niigata-ken, Japan

[73] Assignee: Alps Electric Co., Ltd, Tokyo, Japan

[21] Appl. No.: 08/918,643

[22] Filed: Aug. 22, 1997

Related U.S. Application Data

[62] Division of application No. 08/707,544, Sep. 4, 1996.

[30] Foreign Application Priority Data

Sep. 5, 1995 [JP] Japan .................................. 7-228077

[51] Int. Cl.$^6$ ...................................................... B05D 5/12
[52] U.S. Cl. ............... 427/130; 204/192.34; 204/192.35; 427/131; 427/331; 427/402
[58] Field of Search ..................................... 427/130, 131, 427/331, 402; 204/192.34, 192.35

[56] References Cited

U.S. PATENT DOCUMENTS

| | | |
|---|---|---|
| 4,947,541 | 8/1990 | Toyoda et al. . |
| 5,195,004 | 3/1993 | Okuda et al. . |
| 5,206,590 | 4/1993 | Dieny et al. ............................ 324/252 |
| 5,508,867 | 4/1996 | Cain et al. . |
| 5,528,440 | 6/1996 | Fontana et al. . |
| 5,648,884 | 7/1997 | Lazzari . |
| 5,772,794 | 6/1998 | Uno et al. . |
| 5,784,225 | 7/1998 | Saito et al. . |
| 5,843,589 | 12/1998 | Hoshiya et al. . |

*Primary Examiner*—Bernard Pianalto
*Attorney, Agent, or Firm*—Brinks Hofer Gilson & Lione

[57] ABSTRACT

A magnetoresistive sensor fabricated by creating first antiferromagnetic layers on the upper surfaces of a lower-gap layer, the antiferromagnetic layer having first and second exposed portions separated by a track width formed by the upper surface of the lower-gap layer. Then, a free magnetic layer, a nonmagnetic electrically conductive layer, a pinned magnetic layer and a second antiferromagnetic layer are stacked on the first antiferromagnetic layers and a portion on the track width one after another. Since the free magnetic layer is created after the first antiferromagnetic layer, the free magnetic layer and the first antiferromagnetic layer are adhered to each other with a high degree of reliability. When the direction of magnetization in the free magnetic layer is changed by an external magnetic field, the electrical resistance of the magnetoresistive sensor also changes. The change in electrical resistance is, in turn, used for detecting the external magnetic field. Since the first antiferromagnetic layers put the free magnetic layer in a single-domain state in the X direction, the amount of Barkhausen noise can be reduced.

7 Claims, 3 Drawing Sheets

MAGNETORESISTIVE SENSOR MANUFACTURING METHOD

This application is a division of application Ser. No. 08/707,544, filed Sep. 4, 1996.

BACKGROUND OF THE INVENTION

1. Field of the Invention

In general, the present invention relates to a magnetoresistive sensor mounted on a magnetic recording/reproducing apparatus or another magnetic detecting apparatus. In particular, the present invention relates to a magnetoresistive sensor and its manufacturing method, wherein the magnetoresistive sensor is of the so-called spin-valve type, and wherein the electrical resistance thereof varies due to a change in relation between the direction of the magnetization of a pinned magnetic layer and the direction of magnetization of a free magnetic layer which is affected by an external magnetic field.

2. Description of the Related Art

FIG. 3 is a diagram showing a front view of a magnetoresistive sensor based on the spin-valve effect disclosed in U.S. Pat. No. 5,206,590. The Z direction in the figure is the moving direction of a magnetic recording medium such as a rigid disk relative to the magnetoresistive sensor whereas the Y direction is the direction of a leaking magnetic field (an external magnetic field) from the magnetic recording medium.

In the magnetoresistive sensor shown in FIG. 3, a non-magnetic underlayer 2 made of a nonmagnetic material such as Ta (tantalum) is created on a lower-gap layer 1 made of typically $Al_2O_3$ (aluminum oxide). A free magnetic layer 3 is created on the nonmagnetic underlayer 2. A nonmagnetic electrically conductive layer 5, a pinned magnetic layer 6 and a second antiferromagnetic layer 7 are stacked on the free magnetic layer 3 with a predetermined width in the X direction one after another in the order they are enumerated. At (i) portions on both edges of the nonmagnetic electrically conductive material 5 and the pinned magnetic material 6, first antiferromagnetic layers 4 are created on the free magnetic layer 3.

An upper layer 8 made of a nonmagnetic material such as Ta is created on the first antiferromagnetic layers 4 on both the sides and on the second antiferromagnetic layer 7 in the middle. Lead layers (electrically conductive layers) 9 are created on the upper layer 8, sandwiching an open track width Tw.

An exchange anisotropic coupling on a film boundary surface between the first antiferromagnetic layer 4 and the free magnetic layer 3 puts the free magnetic layer 3 into a single-domain state in the X direction, orientating the directions of magnetization in the X direction. On the other hand, an exchange anisotropic coupling on a film boundary surface between the second antiferromagnetic layer 7 and the pinned magnetic layer 6 puts the pinned magnetic layer 6 into a single-domain state in the Y direction, fixing the directions of magnetization in the Y direction (a direction perpendicular to the surface of the paper toward the reader).

In the magnetoresistive sensor based on the spin-valve effect, a steady-state current is supplied from the lead layer 9 to the free magnetic layer 3, the nonmagnetic electrically conductive layer 5 and the pinned magnetic layer 6 in the X direction. When a leaking magnetic field (an external magnetic field) from a magnetic recording medium such as a rigid disk is provided in the Y direction, the direction of magnetization of the free magnetic layer 3 changes from the X direction to the Y direction. The change in relation between the direction of magnetization in the free magnetic layer 3 and the pinned direction of magnetization of the pinned magnetic layer 6, which change is caused by a variation in magnetization direction in the free magnetic layer 3, changes the electrical resistance. The change in electrical resistance results in a change in voltage which is used for detecting the leaking magnetic field from the magnetic recording medium.

As described above, in the magnetoresistive sensor shown in FIG. 3, the exchange anisotropic couplings on the film boundary surface between the first antiferromagnetic layer 4 and the free magnetic layer 3 and on the film boundary surface between the second antiferromagnetic field 7 and the pinned magnetic layer 6 orientate the magnetic directions of the free magnetic layer 3 and the pinned magnetic layer 6 respectively in directions perpendicular to each other. As a result, the amount of Barkhausen noise can be reduced, giving rise to a merit that a linear response characteristic of the change in electrical resistance with respect to the leaking magnetic field from the magnetic recording medium can be reliably obtained. In addition, since the dimension of the pinned magnetic layer 6 in the X direction is fixed, the off-track performance with respect to the magnetic recording medium is also good.

In a process of manufacturing a magnetoresistive sensor with a structure shown in FIG. 3, however, after the non-magnetic electrically conductive layer 5, the pinned magnetic layer 6 and the second antiferromagnetic layer 7 are stacked on the free magnetic layer 3 in a sputter processes, it is necessary to remove the nonmagnetic electrically conductive layer 5, the pinned magnetic layer 6 and the second antiferromagnetic layer 7 from the (i) portions using an etching process such as ion milling. In addition, also required is a process for creating the first antiferromagnetic layer 4 on the (i) portions at both edges of the second antiferromagnetic layer 7, the pinned magnetic layer 6 and the nonmagnetic electrically conductive layer 5 each with a fixed dimension in the X direction.

The film thickness of each layer in the magnetoresistive sensor has a value ranging from several tens of Angstroms to several hundreds of Angstroms. The film thickness of the nonmagnetic electrically conductive layer 5 is about several tens of Angstroms. It is extremely difficult to remove the stacked structure comprising the three layers, that is, the nonmagnetic electrically conductive layer 5, the pinned magnetic layer 6 and the second antiferromagnetic layer 7, each having such a very small film thickness by means of ion milling with a high degree of accuracy. From the technological point of view, at the portion (i), it is also difficult to remove only the nonmagnetic electrically conductive layer 5 without removing the free magnetic layer 3 in order to expose the free magnetic layer 3. If a portion of the free magnetic layer 3 is inadvertently removed in this etching process, the magnetic characteristic of the free magnetic layer 3 will be adversely affected. If the nonmagnetic electrically conductive layer 5 is inadvertently left at the portion (i) on the surface of the free magnetic layer 3, on the other hand, the first antiferromagnetic layer 4 created on the free magnetic layer 3 is not closely adhered to the free magnetic layer 3 because of the residual nonmagnetic electrically conductive layer 5. As a result, no exchange anisotropic coupling is generated on the film boundary surface between the first antiferromagnetic layer 4 and the free magnetic layer 3.

SUMMARY OF THE INVENTION

The present invention addresses the problems of the conventional magnetoresistive sensor described above. It is thus an object of the present invention to provide a magnetoresistive sensor and its manufacturing method wherein an antiferromagnetic layer is brought directly in contact with a free magnetic layer in such a way that the former is closely adhered to the latter with a high degree of reliability and each layer of the magnetoresistive sensor can be created with ease.

The magnetoresistive sensor provided by the present invention comprises a free magnetic layer, a nonmagnetic electrically conductive formed on the free magnetic layer, and a pinned magnetic layer formed on the nonmagnetic electrically conductive layer, an antiferromagnetic layer for orientating the directions of magnetization of the free magnetic layer by an exchange anisotropic coupling on the film boundary surface between the two layers, and a pinning layer for pinning the directions of magnetization of the pinned magnetic layer in a direction crossing the direction of magnetization of the free magnetic layer, wherein the electrical resistance of the magnetoresistive sensor changes when the direction of magnetization of the free magnetic layer changes due to an external magnetic field. The magnetoresistive sensor is characterized in that the antiferromagnetic layer is placed beneath the free magnetic layer and includes first and second portions separated by a predetermined track width, and the first and second portions of the antiferromagnetic layer and the free magnetic layer are closely adhered to each other.

It is possible to design the following configurations (a) and (b) in the magnetoresistive sensor provided by the present invention.

(a) Parts of portions on both sides of the lower-gap layer are removed in order to form a predetermined track width. The antiferromagnetic layer portions are then provided in the removed parts. Subsequently, the free magnetic layer is created on the upper surfaces of the antiferromagnetic layers on both sides and the upper surface of a portion on the formed track width between the antiferromagnetic layers.

(b) The antiferromagnetic layer is created on the entire upper surface of the lower-gap layer and a nonmagnetic underlayer having a dimension equal to a predetermined track width is then created on the antiferromagnetic layer. The free magnetic layer is then created on the upper surfaces of the antiferromagnetic layer and the nonmagnetic underlayer.

In addition, the antiferromagnetic layer which forms an exchange anisotropic coupling on the film boundary surface between the layer and the free magnetic layer is typically made of a material such as $\alpha$-$Fe_2O_3$ (iron oxide), NiO (nickel oxide), an Ni—Mn (nickel-manganese) alloy or a Pt—Mn (platinum-manganese) alloy.

A method of manufacturing the magnetoresistive sensor with the configuration (a) described above is characterized in that the method comprises: removing parts of portions on both sides on the surface of the lower-gap layer to form a predetermined track width; creating antiferromagnetic layers in the removed parts of the portions on both sides on the lower-gap layer; stacking a free magnetic layer, a nonmagnetic electrically conductive layer and a pinned magnetic layer one after another on the antiferromagnetic layers on both sides and a nonmagnetic underlayer on the lower-gap layer between the antiferromagnetic layers; and creating a pinning layer for fixing the directions of magnetization of the pinned magnetic layer in a direction crossing the direction of magnetization of the free magnetic layer.

A method of manufacturing the magnetoresistive sensor with the configuration (b) described above is characterized in that the method comprises: creating an antiferromagnetic layer on the entire surface of a lower-gap layer and a nonmagnetic underlayer on the antiferromagnetic layer; a process of removing the nonmagnetic underlayer to form a predetermined track width and exposing said antiferromagnetic layer on both sides; a process of stacking a free magnetic layer, a nonmagnetic electrically conductive layer and a pinned magnetic layer one after another on the upper surface of the antiferromagnetic layers exposed on both the sides of the nonmagnetic layer and on the upper surface of the nonmagnetic layer; and creating a pinning layer for pinning the directions of magnetization of the pinned magnetic layer in a direction crossing the direction of magnetization of the free magnetic layer.

In this present invention, unlike the conventional magnetoresistive sensor shown in FIG. 3, the antiferromagnetic layer for orientating the direction of magnetization of the free magnetic layer is created beneath the free magnetic layer. It is thus not necessary to remove both the edges of the nonmagnetic electrically conductive layer and the pinned magnetic layer created on the free magnetic layer, making the manufacturing of the magnetoresistive sensor provided by the present invention very simple. In addition, the free magnetic layer can be closely adhered to the antiferromagnetic layer, making it possible to orientate the direction of magnetization of the free magnetic layer with a high degree of reliability.

In addition, $\alpha$-$Fe_2O_3$, NiO, the Ni—Mn alloy or the Pt—Mn alloy used for making the antiferromagnetic layer is a corrosion-proof material. Accordingly, when the antiferromagnetic layer is created first and the free magnetic layer is then created on the antiferromagnetic material, since the surface of the antiferromagnetic layer is corrosion proof, the antiferromagnetic material and the free magnetic material created thereon can be closely adhered to each other. As a result, it is possible to display an exchange anisotropic coupling on the film boundary surface between the two layers.

By the same token, in the method of manufacturing the magnetoresistive sensor provided by the present invention, it is not necessary to etch the nonmagnetic electrically conductive layer, the pinned magnetic layer and the pinning layer for pinning the direction of magnetization of the pinned magnetic layer. As a result, the processes of manufacturing the layers become very simple.

DESCRIPTION OF THE PREFERRED EMBODIMENTS

Figure 1:
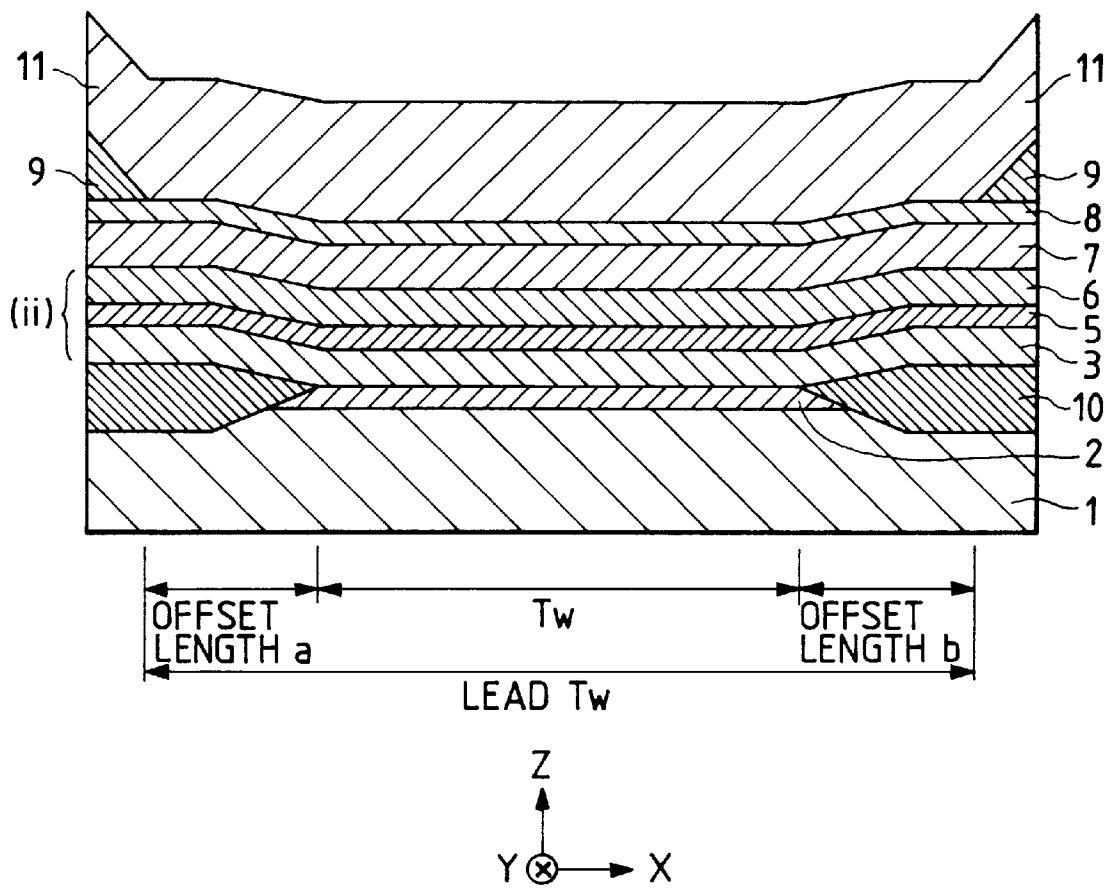
FIG. 1 is a diagram showing a front view of a magnetoresistive sensor provided by the present invention.
Figure 2:
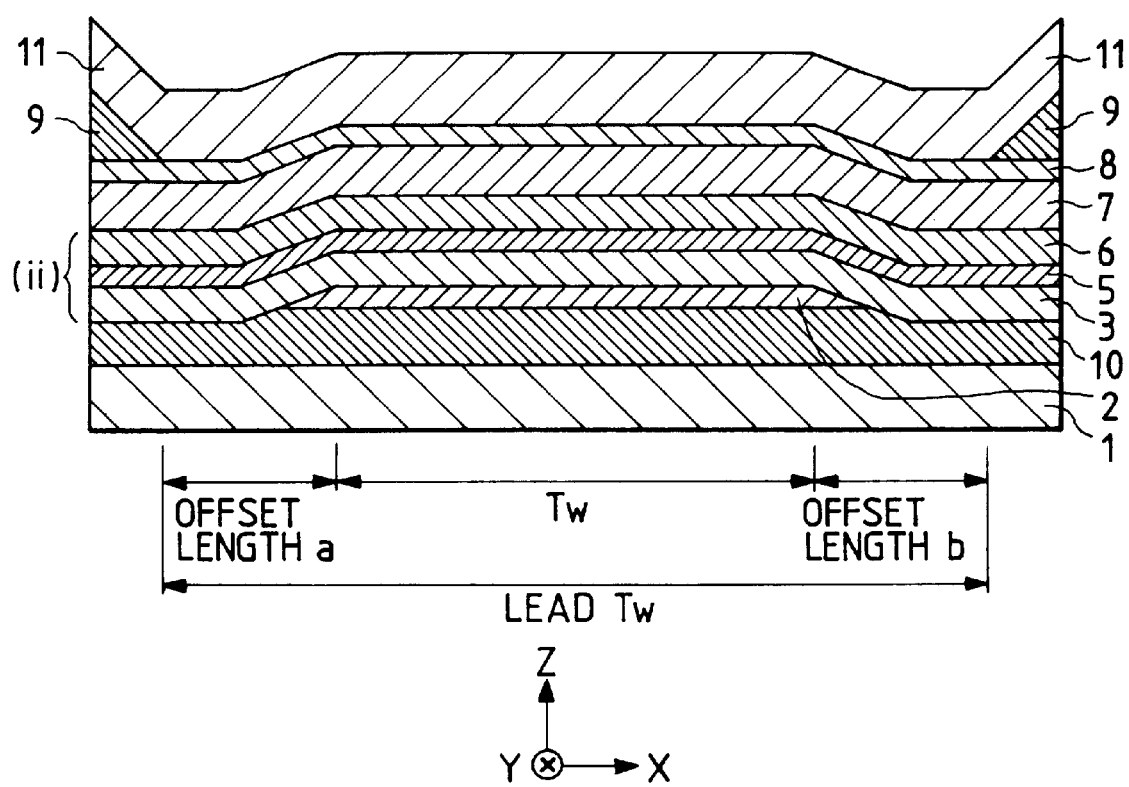
FIG. 2 is a diagram showing a front view of another magnetoresistive sensor provided by the present invention.

FIG. 1 is a diagram showing a front view of a magnetoresistive sensor provided by the present invention and FIG. 2 is a diagram showing a front view of a magnetoresistive sensor provided by the present invention with a structure different from that of the magnetoresistive sensor shown in FIG. 1. Both of these magnetoresistive sensors are both based on the spin-valve effect.

In the magnetoresistive sensors shown in FIGS. 1 and 2, the Z direction is the movement direction of a magnetic recording medium and the Y direction is the direction of a leaking magnetic field (external magnetic field) from the magnetic recording medium.

First of all, the structure of the magnetoresistive sensor shown in FIG. 1 is explained. As shown in the figure, a lower-gap layer 1 of the magnetoresistive sensor is made of $Al_2O_3$ (aluminum oxide) and includes first and second etched (removed) portions separated by a centrally-located un-etched (remaining) portion. A first antiferromagnetic layer 10 is formed over the lower-gap layer 1 and etched such that first and second portions of the antiferromagnetic portion are located in the first and second etched portions of the lower-gap layer 1, and are separated by a predetermined track width Tw. Then, a free magnetic layer 3 is formed which includes first and second sections respectively formed on upper surfaces of the first and second portions of the antiferromagnetic layers 10 on both sides and on the upper surface of the portion on the track width Tw of the lower-gap layer 1. The free magnetic layer 3 is made of an Ni—Fe (nickel-iron) alloy.

An exchange anisotropic coupling on the film boundary surface between the first antiferromagnetic layer 10 and the free magnetic layer 3 puts the free magnetic layer 3 into a single-domain state in the X direction, orientating the directions of magnetization of the free magnetic layer 3 in the X direction. For this reason, the first antiferromagnetic layer 10 is made of a material that an exhibits exchange anisotropic coupling with the free magnetic layer 3. In the case of the structure shown in FIG. 1, however, the first antiferromagnetic layer 10 is created first and the free magnetic layer 3 is created thereon. For this reason, it is necessary to make the first antiferromagnetic layer of a material, the surface of which is not prone to corrosion after the layer is created. This is because, if the surface of the first antiferromagnetic layer 10 corrodes, the close adherence between the first antiferromagnetic layer 10 and the free magnetic layer 3 deteriorates. It is therefore desirable to make the first antiferromagnetic layer 10 of one of $\alpha$-$Fe_2O_3$ (iron oxide), NiO (nickel oxide), an Ni—Mn (nickel-manganese) alloy or a Pt—Mn (platinum-manganese) alloy, a material which exhibits an exchange anisotropic coupling with the free magnetic layer 3 and is not prone to corrosion.

In addition, in the case of the first antiferromagnetic layer 10 made of $\alpha$-$Fe_2O_3$, not only does the first antiferromagnetic layer 10 provide an exchange anisotropic magnetic field Hex to the free magnetic layer 3, but the coercive force Hc of the free magnetic layer 3 created on the first antiferromagnetic layer 10 can also be increased. As a result, the direction of the magnetization of the free magnetic layer 3 on the track width Tw can be stabilized, allowing the amount of Barkhausen noise to be reduced. On the top of that, at portions of offset lengths (a) and (b) on both the sides of the track width Tw, the exchange anisotropic magnetic field Hex provided to the free magnetic layer 3 by the first antiferromagnetic layers 10, which are made of $\alpha$-$Fe_2O_3$, increases, and in addition, the coercive force Hc of the free magnetic layer 3 at portions closely adhered to the first antiferromagnetic layers 10 also increases as well. As a result, at the portions of the offset lengths (a) and (b), the magnetization of the free magnetic layer 3 is fixed in the X direction. In this state, the direction of the magnetization of the free magnetic layer 3 is hardly affected by a leaking magnetic field from the magnetic recording medium, improving the off-track performance.

It should be noted that, at the portion of the track width Tw, the free magnetic layer 3 can be created directly above the lower-gap layer 1. It is desirable, nonetheless, to create a nonmagnetic underlayer 2 made of a nonmagnetic material such as Ta (tantalum) on the lower-gap layer 1 and then to create the free magnetic layer 3 on the nonmagnetic underlayer 2. The nonmagnetic underlayer 2 has a bcc structure (body-centered-cubic structure) and the free magnetic layer 3 is created on the nonmagnetic underlayer 2 to form crystal orientation, allowing a function for reducing the relative electrical resistance of the free magnetic layer 3 to be exhibited.

A nonmagnetic electrically conductive layer 5, a pinned magnetic layer 6 and a second antiferromagnetic (pinning) layer 7 are then stacked on the free magnetic layer 3 one after another in the order the layers 5, 6 and 7 are enumerated. The nonmagnetic electrically conductive layer 5 is typically made of Cu (Copper). Much like the free magnetic layer 3, on the other hand, the pinned magnetic layer 6 is made of the Ni—Fe alloy. As for the second antiferromagnetic layer 7, any of a Pt—Mn (Platinum-manganese) alloy, an Fe—Mn (iron-manganese) alloy or the Ni—Mn (nickel-manganese) alloy can be used. An exchange anisotropic coupling on the film boundary surface between the second antiferromagnetic layer 7 and the pinned magnetic layer 6 puts the pinned magnetic layer 6 into a single-domain state in the Y direction, fixing the directions of magnetization in the Y direction (a direction perpendicular to the surface of the paper away from the reader).

An upper layer 8 which is typically made of Ta is created on the second antiferromagnetic layer 7. Lead layers (electrically conductive layers) 9 are created on the upper layer 8, sandwiching an open lead track width (Lead Tw). The lead layers 9 are each typically made of an electrically conductive material such as Cu, Ta or W (tungsten). An upper-gap layer 11 which is typically made of $Al_2O_3$ is then created above the upper layer 8 and the lead layers 9.

Next, another structure of the magnetoresistive sensor shown in FIG. 2 is explained.

In the case of the magnetoresistive sensor shown in FIG. 2, the first antiferromagnetic layer 10 is created over the entire upper surface of the lower-gap layer 1. The nonmagnetic underlayer 2, which is typically made of Ta, is created at the portion of the track width Tw on the first antiferromagnetic layer 10 such that upper surfaces of first and second portions of the antiferromagnetic layer 10 are exposed on opposite sides of the nonmagnetic underlayer 2. Then, the free magnetic layer 3 is created with first and second sections respectively formed on the exposed upper surfaces of the first antiferromagnetic layer 10 and a third section connecting the first and second sections which is formed on the nonmagnetic underlayer 2. Furthermore, the nonmagnetic electrically conductive layer 5, the pinned magnetic layer 6 and the second antiferromagnetic layer 7 are stacked on the free magnetic layer 3 one after another in the order the layers 5, 6 and 7 are enumerated.

Much like the magnetoresistive sensor shown in FIG. 1, in the magnetoresistive sensor shown in FIG. 2, the first antiferromagnetic layer 10 is made of $\alpha$-$Fe_2O_3$, NiO, the Ni—Mn alloy or the Pt—Mn alloy. The second antiferromagnetic layer 7 is made of the Pt—Mn alloy, the Fe—Mn alloy or the Ni—Mn alloy. The free magnetic layer 3 and the pinned magnetic layer 6 are, on the other hand, made of the Ni—Fe alloy. The nonmagnetic electrically conductive layer 5 is typically made of Cu.

The first antiferromagnetic layer 10 puts the free magnetic layer 3 in a single-domain state in the X direction, orientating the directions of magnetization of the free magnetic layer 3 in the X direction. On the other hand, an exchange anisotropic coupling on the film boundary surface between the second antiferromagnetic layer 7 and the pinned magnetic layer 6 puts the pinned magnetic layer 6 into a single-domain state in the Y direction, fixing the directions of magnetization in the Y direction (a direction perpendicular to the surface of the paper away from the reader).

The upper layer 8 which is typically made of Ta is created on the second antiferromagnetic layer 7. The lead layers 9 are created on the upper layer 8, sandwiching a lead track width (Lead Tw). The upper-gap layer 11 is then created above the upper layer 8 and the lead layers 9.

In both the magnetoresistive sensors shown in FIGS. 1 and 2, on both the sides of the track width Tw, first and second spaced-apart portions of the antiferromagnetic layer 10 are closely adhered to the lower surface of the free magnetic layer 3. The directions of magnetization of the free magnetic layer 3 are orientated in the X direction by an exchange anisotropic magnetic field Hex of the first antiferromagnetic layer 10. On the other hand, the directions of magnetization of the pinned magnetic layer 6 are orientated by the second antiferromagnetic layer 7 in a direction perpendicular to the surface of the paper away from the reader. A steady-state current is supplied from the lead layer 9 to the free magnetic layer 3, the nonmagnetic electrically conductive layer 5 and the pinned magnetic layer 6 in the X direction. When a magnetic field from the magnetic recording medium is provided in the Y direction, the direction of magnetization of the free magnetic layer 3 changes from the X direction to the Y direction. The change in relation between the direction of magnetization in the free magnetic layer 3 and the direction of magnetization of the pinned magnetic layer 6 which change is caused by a variation in magnetization direction in the free magnetic layer 3 changes the electrical resistance of the magnetoresistive sensor. The change in electrical resistance results in a change in voltage for the steady-state current which voltage change is used for detecting the magnetic field from the magnetic recording medium.

In both the magnetoresistive sensors shown in FIGS. 1 and 2, the first and second antiferromagnetic layers 10 and 7 are provided at locations which are separated from each other so that the first and second antiferromagnetic layers 10 and 7 do not affect each other. As a result, it is easy to orientate the directions of magnetization of the free magnetic layer 3 and the pinned magnetic layer 6 in directions which are perpendicular to each other.

The magnetization of the pinned magnetic layer 6 is fixed in the Y direction by an exchange anisotropic coupling on the film boundary surface between the pinned magnetic layer 6 and the second antiferromagnetic layer 7 which is created over the entire surface of the pinned magnetic layer 6. In addition, in the case of the first antiferromagnetic layer 10 made of $\alpha$-$Fe_2O_3$, not only the first antiferromagnetic layer 10 provides an exchange anisotropic magnetic field Hex to the free magnetic layer 3 created thereon, but the coercive force Hc of portions of the free magnetic layer 3 closely adhered to the first antiferromagnetic layer 10 can also be increased. As a result, the direction of magnetization of the free magnetic layer 3 on portions other than the track width Tw in the X direction can be stabilized and since the magnetization of portions of the offset lengths (a) and (b) is hardly affected by the external magnetic field, the off-track performance is excellent.

In addition, the electrical resistance of the magnetoresistive sensor as a whole is determined by the lead track width (Lead Tw). As a result, by setting the gap between the lead layers 9 with a high degree of accuracy, variations in electrical resistance of the magnetoresistive sensor as a whole against a steady-state current become small.

Next, methods of manufacturing the magnetoresistive sensors shown in FIGS. 1 and 2 are explained.

Processes of manufacturing the magnetoresistive sensor shown in FIG. 1 are described as follows.

① The nonmagnetic underlayer 2 is created on the lower-gap layer 1 by means of a sputtering technique. Then, the upper surface of the nonmagnetic underlayer 2 is coated with a resist material prior to exposure and development processes. The resist layer is created only on the portion of the track width Tw. The track width Tw is set by this resist layer. Then, by means of an etching technique such as ion milling, the nonmagnetic underlayer 2 and part of the lower-gap layer 1 of areas where the resist layer are not created, that is, on both the sides of the track width Tw, are removed.

② With the resist layer created on the nonmagnetic underlayer 2, the first antiferromagnetic layers 10 are created by using a sputtering technique on the lower-gap layer 1 on both sides. Thereafter, the resist layer is removed by means of an etch-back method.

③ The surfaces of the first antiferromagnetic layers 10 and the nonmagnetic underlayer 2 are cleaned by using a reverse sputtering technique. Then, the free magnetic layer 3, the nonmagnetic electrically conductive layer 5, the pinned magnetic layer 6, the second ferromagnetic layer 7 and the upper layer 8 are created continuously one after another using a sputtering technique.

④ A resist layer is created on the portion of the lead track width (Lead Tw) on the upper layer 8. With the resist layer put in its state as it is, the leads 9 are created. Then, the resist layer is removed. In this way, the leads layers 9 are created on the upper layer 8, sandwiching a gap, that is, the lead track width (Lead Tw). Thereafter, the upper-gap layer 11 is created on the upper surfaces of the upper layer 8 and the lead layers 9.

Figure 3:
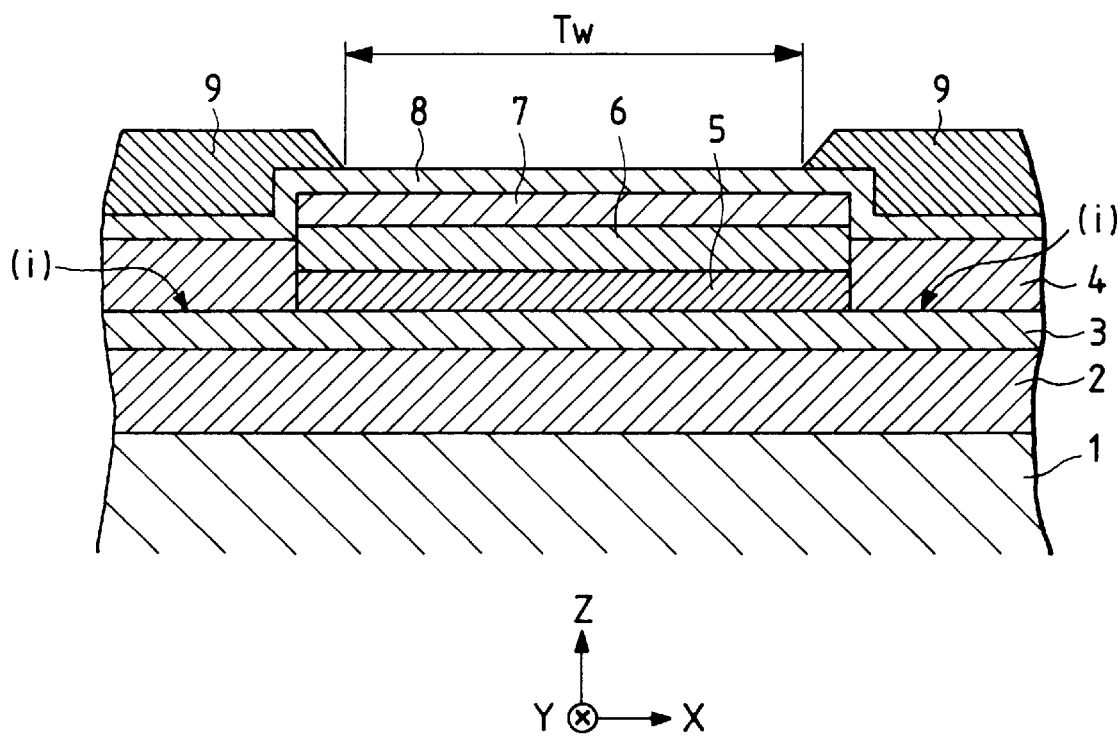
FIG. 3 is a diagram showing a front view of the conventional magnetoresistive sensor.

The magnetoresistive sensor shown in FIG. 1 can be manufactured through the processes described above. In these manufacturing processes, a resist layer is created on the nonmagnetic underlayer 2 in order to set the track width Tw. By means of ion milling, portions of the nonmagnetic underlayer 2 and part of the lower-gap layer 1 are removed and the first antiferromagnetic layers 10 are then created. Thereafter, layers from the free magnetic layer 3 to the upper layer 8 are created continuously one after another without etching. In this way, the film making processes can be made simple. In addition, processes for the conventional magnetoresistive sensor shown in FIG. 3 to remove thin layers by means of etching are not required.

In the processes of manufacturing the magnetoresistive sensor shown in FIG. 1, at a point of time after the upper layer 8 has been created, the lead track width (Lead Tw) is set by another resist layer. As alternative subsequent processes, on both the sides of the lead track width (Lead Tw), layers from the upper layer 8 to the free magnetic layer 3 or to portions of the surfaces of the first antiferromagnetic layers 10 are etched by means of ion milling and the lead layers 9 are then created on the antiferromagnetic layers 10 on both the sides of the lead track width (Lead Tw). In this case, even though the number of etching steps using the ion milling-technique increases, the depth accuracy of the etching processes using the ion-milling technique is not required because the first antiferromagnetic layers 10 and the free magnetic layer 3 are already closely adhered to each other.

For example, even if some of the free magnetic layer 3 is left on the first antiferromagnetic layer 10 and the lead layer 9 is created thereon, no functional problem arises.

Processes of manufacturing the magnetoresistive sensor shown in FIG. 2 are explained as follows.

① The first antiferromagnetic layer 10 is created over the entire surface of the lower-gap layer 1 using a sputtering technique. Subsequently, the nonmagnetic underlayer 2 is created on the first antiferromagnetic layer 10 also using a sputtering technique. Then, a resist layer for setting the track width Tw is created on the nonmagnetic underlayer 2. Subsequently, the nonmagnetic underlayer 2 and a portion of the antiferromagnetic layer 10 in areas where the resist layer is not created are removed by an etching technique such as ion milling.

② Thereafter, layers from the free magnetic layer 3 to the upper layer 8 are continuously created one after another. By the same token, the lead layers 9 and the upper-gap layer 11 are created.

As described above, in the case of the method of manufacturing the magnetoresistive sensor shown in FIG. 1, the nonmagnetic underlayer 2 and the lower-gap layer 1 are removed by an etching technique such as ion milling. The etching depth does not have an effect on the magnetoresistive sensor. Also in the case of the method of manufacturing the magnetoresistive sensor shown in FIG. 2, the functions of the magnetoresistive sensor are not affected even if an error is generated in the etching depth for the first antiferromagnetic layer 10. In addition, at the point of time the free magnetic layer 3 is created, the free magnetic layer 3 and the first antiferromagnetic layer 10 are closely adhered to each other with a high degree of reliability on both the sides of the track width Tw. As a result, the manufacturing methods become simple. In addition, the directions of magnetization in the free magnetic layer 3 of the magnetoresistive sensor after the manufacturing are orientated in one direction with a high degree of reliability and the amount of the Barkhausen noise is also reduced as well.

As described above, in both the magnetoresistive sensors shown in FIGS. 1 and 2, the second antiferromagnetic layer 7 is used for putting the pinned magnetic layer 6 in a single-domain state in the Y direction. It should be noted that, as an alternative, a magnetic material with a large coercive force Hc can be created on the pinned magnetic layer 6 and the permanent magnetization of the magnetic material is used for orientating the directions of magnetization in the pinned magnetic layer 6 in the Y direction.

According to the present invention, the antiferromagnetic layer for magnetizing the free magnetic layer in one direction is closely adhered to the lower surface of the free magnetic layer. In this way, the free magnetic layer and the antiferromagnetic layer are adhered to each other with a high degree of reliability, allowing the direction of magnetization of the free magnetic layer to be stabilized. In particular, in the case of an antiferromagnetic layer made of $\alpha$-Fe$_2$O$_3$, the magnetization of the free magnetization layer at portions other than the track width is stabilized, improving the off-track performance.

Unlike the conventional magnetoresistive sensor, the number of processes to etch layers can be reduced, making it possible to make the manufacturing processes simple. In addition, unlike the conventional magnetoresistive sensor, the state of adherence of the free magnetic layer and the antiferromagnetic layer is not affected by the etching accuracy and, at the time the free magnetic layer is created, the free magnetic layer and the antiferromagnetic layer can be adhered to each other with a high degree of reliability.

What is claimed is:

1. A method of manufacturing a magnetoresistive sensor, comprising:

forming an antiferromagnetic layer on a lower-gap layer;

forming a nonmagnetic layer on an upper surface of the antiferromagnetic layer;

removing portions of the nonmagnetic layer such that a remaining portion of the nonmagnetic layer has a length substantially equal to a track width of the magnetoresistive sensor, and first and second portions of the antiferromagnetic layer are exposed on opposite sides of the remaining portion of the nonmagnetic layer;

forming a free magnetic layer on the first and second portions of the antiferromagnetic layer and on the remaining portion of the nonmagnetic layer, a direction of magnetization of the free magnetic layer being oriented through exchange anisotropic coupling with the first and second portions of the first antiferromagnetic layer;

forming a nonmagnetic electrically conductive layer on an upper surface of the free magnetic layer;

forming a pinned magnetic layer on an upper surface of the nonmagnetic electrically conductive layer; and forming a pinning layer on an upper surface of the pinned magnetic layer, wherein a direction of magnetization of the pinned magnetic layer is pinned through exchange anisotropic coupling with the pinning layer such that the pinned direction of magnetization crosses the orientated direction of magnetization of the free magnetic layer.

2. A method of manufacturing a magnetoresistive sensor according to claim 1, further comprising forming a resist pattern having a length substantially equal to the track width on the nonmagnetic layer before the nonmagnetic layer and the antiferromagnetic layer are removed, forming a first portion and a second portion of the nonmagnetic layer exposed at both sides of the resist pattern, and removing the resist pattern before the free magnetic layer is formed.

3. A method of manufacturing a magnetoresistive sensor according to claim 1, wherein the nonmagnetic layer comprises Ta.

4. A method of manufacturing a magnetoresistive sensor according to claim 1, wherein the removing step comprises performed by an etching process.

5. A method of manufacturing a magnetoresistive sensor according to claim 1, wherein the antiferromagnetic layer comprises an antiferromagnetic material selected from the group consisting of $\alpha$-Fe$_2$O$_3$, NiO, Ni—Mn alloys, and Pt—Mn alloys.

6. A method of manufacturing a magnetoresistive sensor according to claim 1, wherein the pinning layer comprises an antiferromagnetic material selected from the group consisting of Fe—Mn alloys, Ni—Mn alloys, and Pt—Mn alloys.

7. A method of manufacturing a magnetoresistive sensor according to claim 1, wherein the etching process comprises an ion milling method.

* * * * *

UNITED STATES PATENT AND TRADEMARK OFFICE
CERTIFICATE OF CORRECTION

PATENT NO. : 5,972,420
DATED : October 26, 1999
INVENTOR(S) : Masamichi Saito et al.

It is certified that error appears in the above-identified patent and that said Letters Patent is hereby corrected as shown below:

Claim 4,
Line 3, delete "performed by" and substitute -- performing -- in its place.

Signed and Sealed this

Second Day of October, 2001

Attest:

NICHOLAS P. GODICI
Attesting Officer   Acting Director of the United States Patent and Trademark Office